(12) United States Patent
Akram et al.

(10) Patent No.: US 6,274,390 B1
(45) Date of Patent: Aug. 14, 2001

(54) METHOD AND APPARATUS PROVIDING REDUNDANCY FOR FABRICATING HIGHLY RELIABLE MEMORY MODULES

(75) Inventors: Salman Akram; James M. Wark; David R. Hembree, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,274

(22) Filed: Aug. 31, 2000

Related U.S. Application Data

(63) Continuation of application No. 09/443,080, filed on Nov. 18, 1999, which is a continuation of application No. 08/728,302, filed on Oct. 8, 1996, now Pat. No. 6,008,538.

(51) Int. Cl.[7] .................................................. H01L 21/00
(52) U.S. Cl. .................................................. 438/4; 438/15
(58) Field of Search ........................ 438/4, 15; 365/200, 365/185.09

(56) References Cited

U.S. PATENT DOCUMENTS

| | | |
|---|---|---|
| 4,727,513 | 2/1988 | Clayton . |
| 4,806,503 | 2/1989 | Yoshida et al. . |
| 4,992,850 | 2/1991 | Corbett et al. . |
| 5,058,071 | 10/1991 | Kohda et al. . |
| 5,107,328 | 4/1992 | Kinsman . |
| 5,123,016 | 6/1992 | Muller et al. . |
| 5,137,836 | 8/1992 | Lam . |
| 5,138,434 | 8/1992 | Wood et al. . |
| 5,155,067 | 10/1992 | Wood et al. . |
| 5,168,345 | 12/1992 | Brossart . |
| 5,182,632 | 1/1993 | Bechtel et al. . |
| 5,239,747 | 8/1993 | Ewers . |
| 5,309,020 | 5/1994 | Murasawa et al. . |
| 5,311,396 | 5/1994 | Steffen . |
| 5,313,097 | 5/1994 | Haj-Ali-Ahmadi et al. . |
| 5,319,243 | 6/1994 | Leicht et al. . |
| 5,327,008 | 7/1994 | Djennas et al. . |
| 5,355,283 | 10/1994 | Marrs et al. . |
| 5,365,409 | 11/1994 | Kwon et al. . |
| 5,378,981 | 1/1995 | Higgins, III . |
| 5,391,917 | 2/1995 | Gilmour et al. . |
| 5,391,922 | 2/1995 | Matsui . |
| 5,399,903 | 3/1995 | Rostoker et al. . |
| 5,424,492 | 6/1995 | Petty et al. . |
| 5,424,652 | 6/1995 | Hembree et al. . |
| 5,448,165 | 9/1995 | Hodge et al. . |
| 5,461,544 | 10/1995 | Ewers . |
| 5,463,249 | 10/1995 | Shinbo et al. . |
| 5,468,655 | 11/1995 | Greer . |
| 5,475,317 | 12/1995 | Smith . |
| 5,491,360 | 2/1996 | Lin . |
| 5,523,619 | 6/1996 | McAllister et al. . |
| 5,642,262 | 6/1997 | Terrill et al. . |
| 5,644,541 | 7/1997 | Siu et al. . |
| 5,657,280 | 8/1997 | Shin et al. . |
| 5,668,763 | 9/1997 | Fujioka et al. . |
| 5,670,824 | 9/1997 | Weinberg . |

*Primary Examiner*—Olik Chaudhuri
*Assistant Examiner*—Douglas A. Wille
(74) *Attorney, Agent, or Firm*—TraskBritt

(57) ABSTRACT

A method and apparatus for repair of a multi-chip module, such as a memory module, is provided where at least one redundant or auxiliary chip attach location is provided on the substrate of the multi-chip module. The auxiliary chip attach location preferably provides contacts for attachment of more than one type of replacement semiconductor chip. Accordingly, when one or more chips on the multi-chip module are found to be completely or partially defective, at least one replacement chip can be selected and attached to the auxiliary location to provide additional memory to bring the module back to its design capacity.

21 Claims, 9 Drawing Sheets

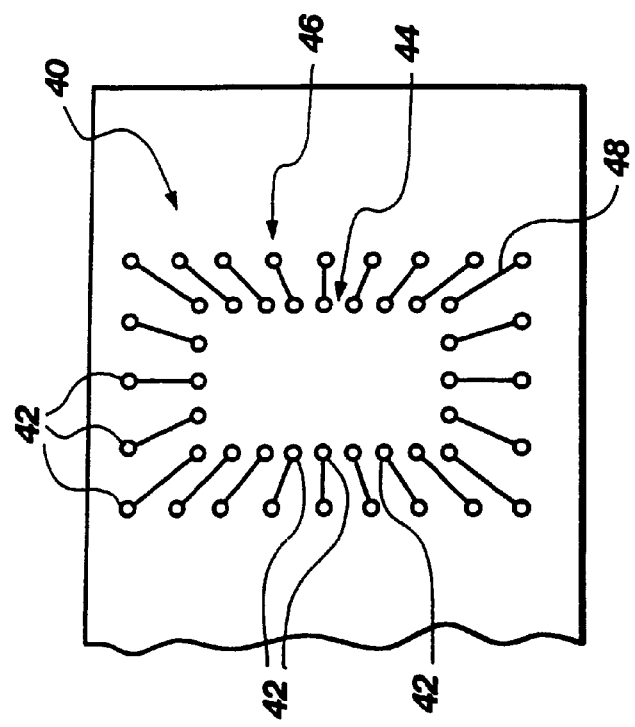

METHOD AND APPARATUS PROVIDING REDUNDANCY FOR FABRICATING HIGHLY RELIABLE MEMORY MODULES

CROSS-REFERENCE TO RELATED APPLICATIONS

This application is a continuation of application Ser. No. 09/443,080, filed Nov. 18, 1999, pending, which is a continuation of application Ser. No. 08/728,302, filed Oct. 8, 1996, now U.S. Pat. No. 6,008,538, issued Dec. 28, 1999.

BACKGROUND OF THE INVENTION

1. Field of the Invention

This invention relates generally to single in-line memory modules (SIMMs), dual in-line memory modules (DIMMs), and the like, and, more specifically, to SIMM, DIMM and other memory module boards providing at least one extra die site for attachment of an additional die to replace a defective die or dice thereon.

2. State of the Art

An integrated circuit (IC) typically includes a semiconductor die (die) electrically attached to a lead frame providing physical support for the die and connecting the die to external circuitry, such as a printed circuit board or other conductor-carrying substrate. In such an arrangement, the lead frame and die may be connected by wire bonding the lead fingers of the lead frame to contact or bond pads located on a surface of the die. The die and lead frame are then typically encapsulated within a transfer-molded plastic package, although ceramic and metal packages may also be used, depending on the operating environment and the packaging requirements of the die.

As the demand for memory, in particular random access memory (RAM), surpassed the memory capability of a single die, multichip modules (MCMs) were developed, such modules having a number of memory devices attached to a single substrate, such as a printed circuit board. A SIMM is a memory module having multiples of the same basic die, where the semiconductor memory chips are aligned in a row and interconnected to a printed circuit board to, in effect, create a single device with the memory capacity of the combined memory chips. An example of a SIMM including a plurality of dynamic random access memory devices (DRAMs) used as memory in a computer is illustrated in U.S. Pat. No. 4,992,850, issued Feb. 12, 1991, to Corbett et al., assigned to the assignee of the present invention. As the demand for additional memory on a single device has increased, other devices such as dual in-line memory modules (DIMMs) have also been developed. Such devices, while providing the desired memory capability on a single printed circuit board, present unique problems for the manufacturer when one or more of the semiconductor memory chips thereon fail.

It is well known that semiconductor dice have an early failure rate, often referred to in reliability terms as "infant mortality." Moreover, infant mortality of MCMs is multiplied depending on the number of individual semiconductor dice provided therein. For example, a SIMM composed of ten dice, each die having an individual reliability yield of 95%, would result in a first pass test yield of less than 60%, while a SIMM composed of twenty dice, each die having an individual reliability yield of 95%, would produce a first pass test yield of less than 36%.

When a single packaged dies such as a dual in-line package (DIP), fails, a manufacturer can attempt to repair the device, use the device for some reduced capacity function if the device is only partially defective, or scrap it. When complete failure of a die has not occurred and a portion of the memory is good (e.g., 1, 2, or 3 megabits of a 4 megabit chip), such a device is not typically useful. For MCMs such as a SIMM, where a number of semiconductor dice are attached to a single substrate, however, it may not be possible to use the device for some reduced capacity function and it is surely not desirable to scrap the entire MCM when some, if not most, of the dice attached thereto are not defective. Thus, the manufacturer is left with the somewhat costly process of reworking the MCM, typically by removing the defective chips and replacing them with new ones. Such a procedure is described in U.S. Pat. Nos. 5,239,747 and 5,461,544, where a SIMM having a specialized trace pattern suitable for both burn-in and individual die testing is tested to determine if any of the semiconductor devices mounted thereon are non-functional and, if so, the defective device is replaced with a device which has been subjected to burn-in, or the entire multichip module can be subjected to another burn-in process after the replacement of the defective device. The defective devices, however, are merely replaced by removing the defective device and replacing it with another device either previously subjected to burn-in or not. This rework process can be complicated, time consuming and costly, depending upon the type of device, the type of mounting of the device on the substrate, and the type of substrate used for mounting. For example, plastic-packaged devices are typically physically pulled to disconnect their leads from the module, while so-called "glob topped" (silicone or epoxy gel covering) dice may be removed after cutting through the encapsulant to the wire-bonded die, which is pulled. In addition, since replacing multiple unacceptable dice on an MCM poses physical risks to other MCM dice during the replacement operation, it may be desirable to discard such an MCM rather than attempt rework, particularly where the reliability of the replacement die is not known.

Depending on the extent of testing and/or burn-in procedures employed, a die may typically be classified into varying levels of reliability and quality. For example, a die may meet only minimal quality standards by undergoing standard probe testing or ground testing while still in wafer form, while individual separated or "singulated" dice may be subjected to intelligent burn-in at full-range temperatures with full testing of the die's circuitry. A die that has been so tested is termed a "known good die" (KGD). Examples of methods for the testing and burn-in of an individual die prior to packaging are disclosed in U.S. Pat. Nos. 5,448,165 and 5,475,317.

A cost-effective method for producing known reliable SIMMs, DIMMs, and the like, with larger numbers of chips on a single device is desirable for industry acceptance and use. In an attempt to provide known reliable SIMMs complying with consumer requirements, it would be desirable to fabricate the SIMM completely of KGD. Using only KGD in a SIMM, however, would not currently be cost effective since each KGD has to be subjected to performance and burn-in testing, both of which ate costly at this point in time. Typically, however, SIMMs are fabricated from probe-tested dice, and are subsequently burned-in and performance tested. In contrast to the use of all KGD in a SIMM, when using dice with well-known production and reliability histories, particularly where the dice being used are known to have a low infant mortality rate, the use of such minimally tested dice to produce a SIMM is usually found to be the most cost effective alternative.

As previously stated, since typical testing and burn-in procedures are generally labor and time intensive, posing significant risks to the dice of a SIMM, in the event that a SIMM contains an unacceptable die, replacement of the unacceptable die with a KGD is preferable. Module rework with a KGD does not typically require the SIMM to be subjected to additional burn-in procedures that can unnecessarily stress the dice. An example of a method and apparatus for the testing and burn-in of an individual die prior to packaging is illustrated in U.S. Pat. No 5,424,652, issued Jun. 13, 1995, to Hembree et al., assigned to the assignee of the present invention. Such a method and apparatus provide a source of KGD to allow for the rework of an unacceptable die in an MCM with a KGD. In other instances, it is known to test a die in a package for functionality and replace any defective die. Such is illustrated in U.S. Pat. Nos. 5,137,836, 5,378,981, and 5,468,655.

One way in the art to eliminate the need to physically remove defective or unacceptable dice from a SIMM has been to provide additional, redundant spaces on the printed circuit board for attachment of replacement chips. Thus, one additional space has been provided adjacent each memory chip on the board, the additional spaces providing contacts for attachment of a semiconductor chip similar to the one it is replacing. For example, if a 32 megabit SIMM contains eight 4 megabit chips, then eight additional spaces are provided on the SIMM, configured to accept up to eight additional 4 megabit chips, if necessary. Such a configuration, however, results in a memory module that is approximately twice as big as a memory module having no extra spaces.

Therefore, a need exists for the cost-efficient fabrication of SIMMs, DIMMs, and the like, of known performance and reliability requirements that requires a minimal amount of rework when one or more dice attached thereto are found defective.

BRIEF SUMMARY OF THE INVENTION

Accordingly, a memory module such as a single in-line memory module (SIMM) or dual in-line memory module (DIMM), is provided having at least one redundant or auxiliary chip attach location for attachment of a replacement chip. When one or more dice on a memory module are found defective, one or more replacement chips can be attached to the one or more auxiliary chip attach locations with the size of the replacement chips being at least equal to the amount of defective memory. Thus, the defective dice can be replaced without needing to be physically removed. Moreover, by providing auxiliary chip attach locations that can accept different sizes and memory capacities of replacement semiconductor chips, one replacement chip can replace several defective chips on the memory module.

In a preferred embodiment, a SIMM or DIMM board is provided having a plurality of primary chip attach locations and one auxiliary chip attach location. Each of the plurality of primary chip attach locations is similarly configured to accept the same type of semiconductor chip, such as a number of 4 megabit chips. The auxiliary chip attach location, on the other hand, is configured to accept more than one capacity of replacement semiconductor chip. Thus, depending on the amount of defective memory detected on the SIMM, a replacement chip having at least that amount of good memory can be attached to the auxiliary chip attach location. Consequently, the replacement chip may be a 1 megabit chip, if only one 1 megabit of memory is found defective, or a 4 megabit chip, if an entire 4 megabit chip is found to be defective, the configuration of the auxiliary chip attach location being capable of accepting either replacement chip.

In another preferred embodiment, a SIMM or DIMM is provided having two rows of the same type of semiconductor memory chip and a redundant or additional chip attach location for accepting a variety of semiconductor memory chips. The redundant chip attach location is electronically connected in parallel to the rest of the memory chips so that if one or more memory chips are found defective, an auxiliary replacement chip having an amount of memory approximately equal to that found defective can be attached to the additional chip attach location.

Having the capability to easily and cost effectively rework memory modules without the need to remove defective chips or the need to substitute defective chips on a one-to-one basis is highly desirable. The ability to provide auxiliary chip attach locations that can accommodate a plurality of different chip configurations not only makes rework more simple, but allows memory modules with large numbers of chips to be cost effective. For example, in yet another preferred embodiment, a memory module having three rows of similar memory chips is provided with more than one auxiliary chip attach location, each of the auxiliary chip attach locations being capable of receiving more than one type of semiconductor die. Thus, if only one of the many chips provided thereon fails entirely, then one substantially identically configured chip can be attached to any one of the three auxiliary chip attach locations. If more than one memory chip fails or more defective memory is located than can be replaced with a single auxiliary chip, then, if necessary, more than one replacement chip can be attached to any one or more of the three auxiliary chip attach locations.

In yet another preferred embodiment, rather than having all of the auxiliary chip attach locations capable of receiving variously configured chips, at least two auxiliary chip attach locations are each provided with different configurations. Thus, depending on the number of bad memory chips, one or more chips having a combined memory capacity substantially equal to the bad memory can be attached to the auxiliary chip attach locations. For example, on a DIMM with five 4 megabit chips found defective, a replacement 16 megabit chip can be attached to the auxiliary chip attach location configured to receive 16 megabit chips and a replacement 4 megabit chip can be attached to the auxiliary chip attach location configured to receive a 4 megabit chip.

Preferably, the replacement chips are KGD so that the additional burn-in is not required on the memory module. Moreover, the KGD may be partially defective dice or "partials" that are known to be good for a certain capacity of memory (e.g., 3 megabits of a 4 megabit chip). This is particularly attractive, since a high percentage (approaching 50%) for some designs of 16 megabit DRAMS is partially or completely defective, while 5–10% of 4 megabit DRAMS comprise partials. Since partials might otherwise be discarded, beneficial use thereof as replacement chips enhances the effective yield rate for the chips and lowers per-unit-memory costs.

Thus, for example, for a SIMM having a design memory capacity of 32 megabits with 7 of the 32 megabits tested defective, a replacement partial 16 megabit chip known to be good for 7 megabits could be attached to an auxiliary location. The defective memory of 7 megabits on the primary chip(s) could then be disabled. Similarly, for a 32 megabit memory module with 7 bad megabits of memory and more than one auxiliary chip attach location, a replacement full 4 megabit KGD and a 3 megabit "partial" KGD could be attached to two of the auxiliary chip attach locations.

BRIEF DESCRIPTION OF THE SEVERAL VIEWS OF THE DRAWINGS

FIG. 1A is a schematic side view of a chip that has been flip-chip bonded to a substrate;

FIG. 1B is a schematic side view of a chip that has been wire bonded to a substrate;

FIG. 2 is a close-up schematic view of a second embodiment of an auxiliary chip attach location;

DETAILED DESCRIPTION OF THE INVENTION

Figure 1:
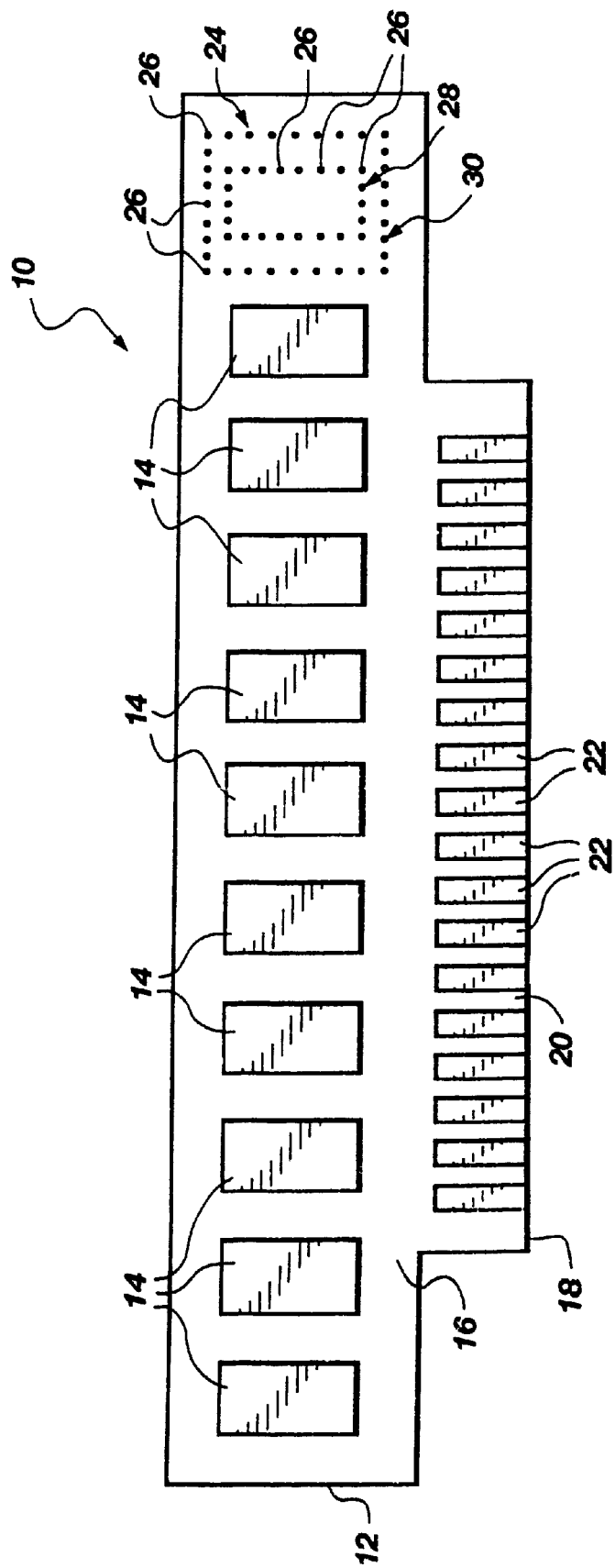
FIG. 1 is a schematic view of a first embodiment of a memory module having an auxiliary chip attach location according to the present invention.

Referring to FIG. 1, a single in-line memory module (SIMM) 10, in accordance with the present invention, is illustrated having an elongate substrate 12, such as a printed circuit board (PCB) or other substrate known in the art, to which a plurality of semiconductor memory chips 14 is attached. The chips 14 are all preferably substantially similar in configuration and memory capacity and are flip-chip bonded to individual chip attach locations of the substrate 12 as is known in the art. That is, as shown in the example of flip-chip bonding of FIG. 1A, the chips 14 are provided with bumped solder balls 15 on each bond pad 17 located on the active surface 19 of the chip 14 and are superimposed over similarly configured contacts or terminals 21 on the surface 16 of the substrate 12, at which time the solder balls 15 are heated and melted or "reflowed" to form a mechanical and electrical connection between the substrate 12 and each chip 14. Other conductive elements, such as a conductive or conductor-filled epoxy, may be employed in lieu of solder. Each chip 14 may also be wire bonded to the substrate 12 as illustrated in FIG. 1B, where, as opposed to FIG. 1A, the chip 14 is positioned on active surface 19 and wire bonds 23 are made between the bond pads 17 of the chip 14 and contacts or terminals 21 on the surface 16 of the substrate 12.

Longitudinally extending along one edge 18 of the SIMM 10, a male socket-type electrical connection 20 is provided having a plurality of electrical contacts 22 configured to interface with a SIMM socket as known in the art. Each of the chips 14 is electrically connected to one or more of the plurality of electrical contacts 22 through various electrical traces carried in or on the substrate 12, as known in the art.

In addition to the standard or primary chip attach locations for the chips 14, a redundant or auxiliary chip attach location 24 is provided on the surface 16. The auxiliary chip attach location 24 is provided with a plurality of contact points or terminals 26 that can be connected to more than one type of replacement semiconductor chip. As shown in FIG. 1, the auxiliary chip attach location 24 is provided with an inner array 28 of contact points or terminals 26 and an outer array 30 of contact points or terminals 26. As better illustrated in the close-up view of FIG. 2, the auxiliary chip attach location 40 includes a plurality of contacts 42 comprising an inner array 44 for attachment of a chip of similar configuration to the chips 14 of FIG. 1. An outer array 46 of contacts 42 forms the appropriate configuration for attachment of a larger-capacity replacement chip. In the illustrated embodiment, each of the contacts 42 of the inner array 44 is connected via a trace 48 to a corresponding contact 42 of the outer array 46. While, in some instances, such a one-to-one correspondence between the contacts 42 of the inner and outer arrays 44 and 46 may be desirable, such a configuration is not required. The configuration of the outer array 46, for example, may depend on the type, size, and configuration of a replacement die to be connected to the outer array 46.

Figure 3:
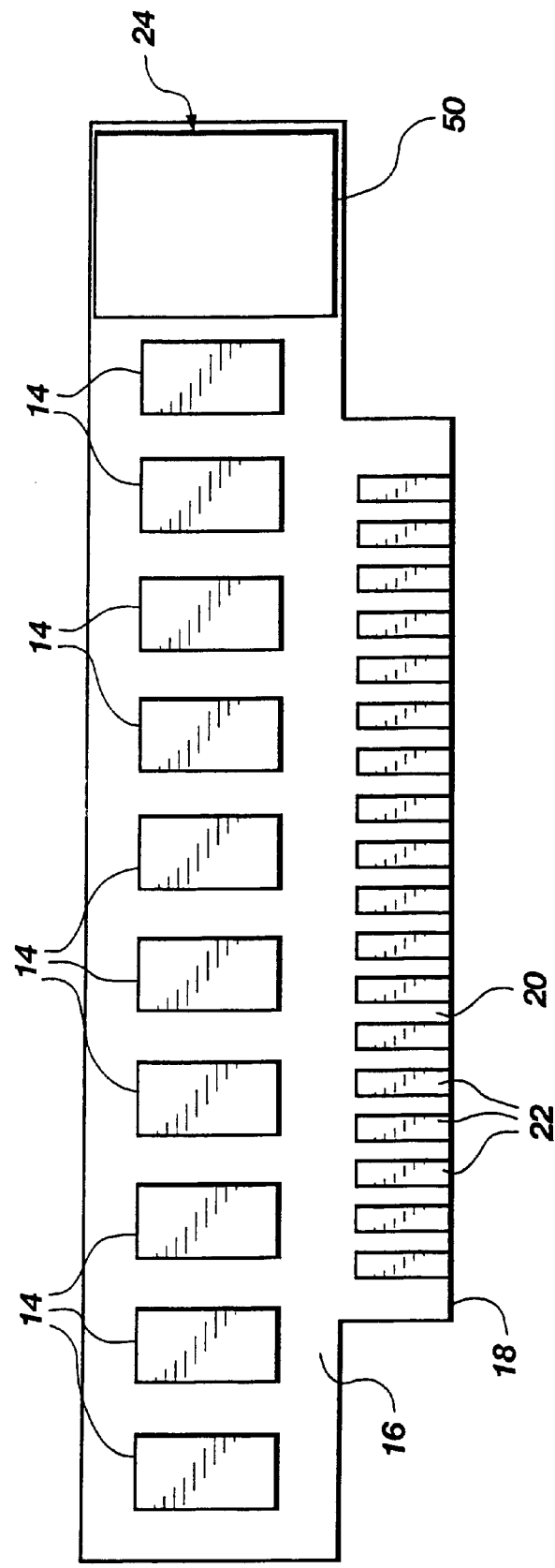
FIG. 3 is a schematic view of the memory module of FIG. 1 including a replacement chip attached to the auxiliary chip attach location.

Accordingly, if during intelligent burn-in of the SIMM 10 one of the ten chips 14 shown in FIG. 1 completely fails, then a replacement chip of substantially similar configuration to chips 14 can be attached to the inner array 28 to replace the failed chip 14. As illustrated in FIG. 3, however, if more than one chip 14 fails or memory equaling the capacity of more than one chip is proven defective during burn-in, it may be necessary to connect a larger-capacity replacement chip 50 to the auxiliary chip attach location, one that provides enough memory to replace the combined memory of the failed chips 14.

It should be noted that the replacement chip may be attached to the module by a technique different from that used to connect chips 14. Thus, the replacement chip may be wire-bonded for ease of attachment, while the chips 14 were flip-chip attached by solder reflow. The replacement chip may then be separately glob-topped or otherwise protected after wire bonding, the primary chips having been previously underfilled and encapsulated during initial fabrication of the module.

Figure 4:
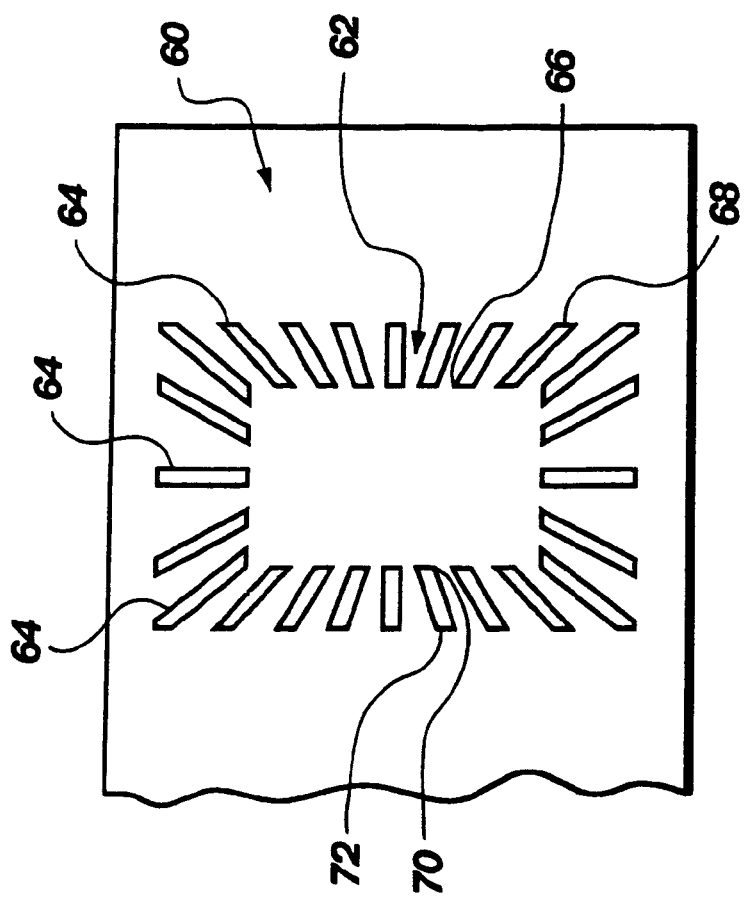
FIG. 4 is a close-up schematic view of a third embodiment of an auxiliary chip attach location.

Referring now to FIG. 4, another preferred embodiment of a chip attach location 60 is illustrated. The single array 62 of the chip attach location 60 is comprised of a plurality of elongate contacts 64 outwardly extending from an inner perimeter 66 to an outer perimeter 68 defined by the inner and outer ends 70 and 72 of each contact 64, respectively. Such a configuration allows attachment of variously sized replacement chips 50, so long as the bond pads of the replacement chip 50 can be bonded to the contacts of the chip attach location 60, whether by wire bonding, such as that illustrated in FIG. 1B, by flip-chip bonding, as illustrated in FIG. 1A, or by other methods known in the art.

Figure 5:
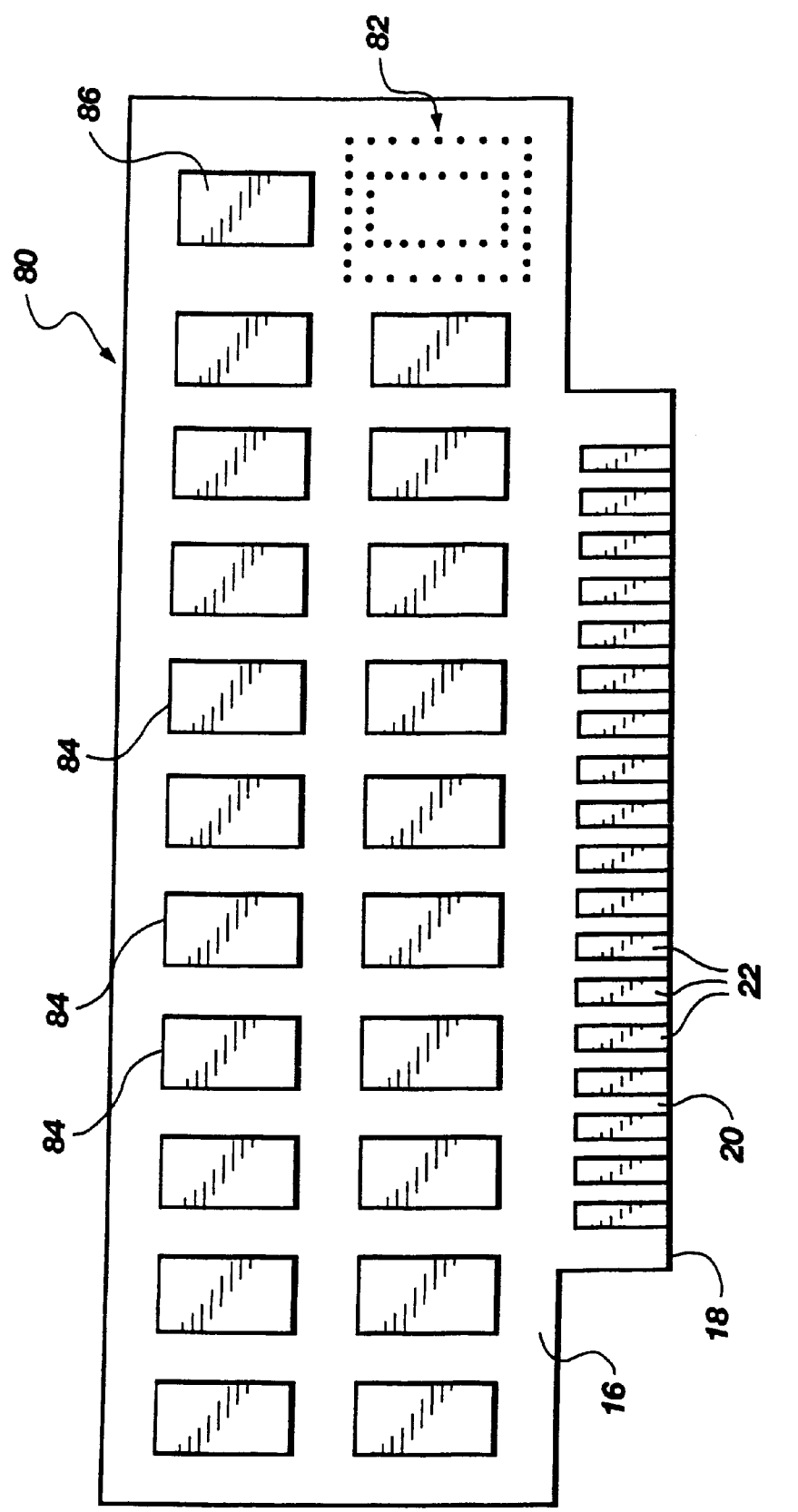
FIG. 5 is schematic view of a second embodiment of a memory module having an auxiliary chip attach location according to the present invention.

As illustrated in FIG. 5, a SIMM or dual in-line memory module (DIMM) 80 including two rows of memory chips 84 can also benefit from having a redundant chip attach location 82 for attachment of an additional or replacement chip if any of the chips 84 provided thereon are found defective. In prior art devices, a SIMM or DIMM 80 having twenty memory chips 84 thereon, as illustrated in FIG. 5, would typically not prove to be cost effective without the aforementioned 100% redundancy of auxiliary to primary chip sites. Having a redundant chip attach location 82 that can accommodate various sizes of replacement memory chips provides an easy, cost effective means of reworking such a device.

Figure 6:
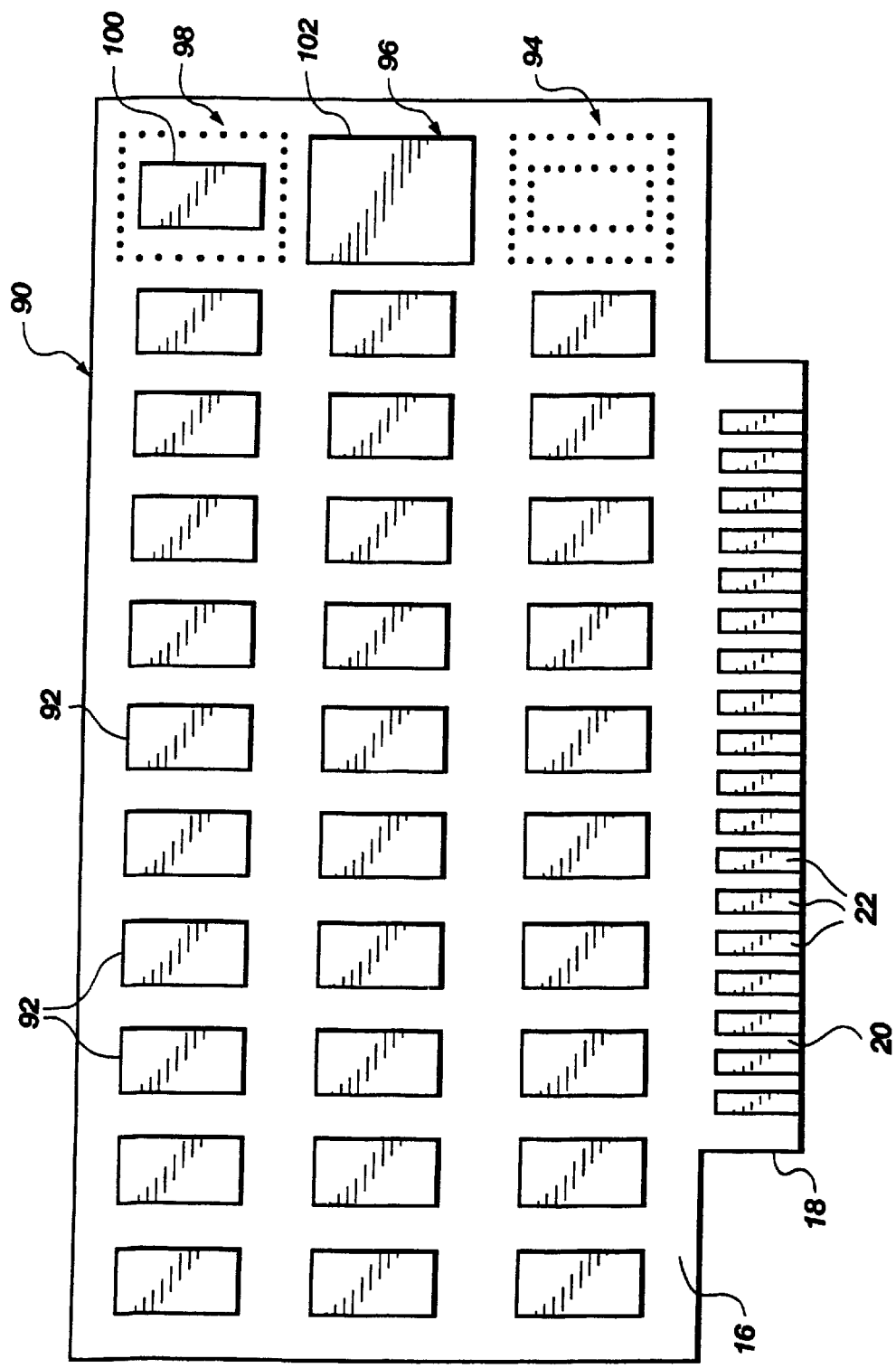
FIG. 6 is a schematic view of a third embodiment of a memory module having three auxiliary chip attach locations, two of which have replacement chips attached thereto according to the present invention.

Similarly, in FIG. 6, a memory module 90 having thirty individual memory chips 92 is made possible by providing at least one auxiliary chip attach location 94. Because of the difficulty associated with reworking a device having so many potentially defective chips, manufacturing such a device as memory module 90 would typically not even be attempted without the exclusive use of pretested known-good-die (KGD). The exclusive use of KGD primary chips would clearly not be cost effect because of the cost associated with testing each chip individually before attaching it to the memory device.

As illustrated in FIG. 6, it may be desirable to provide more than one auxiliary chip attach location 94 such as auxiliary locations 96 and 98. Such a configuration has added benefits because it provides more flexibility for the type and number of chips that can be attached thereto. For example, if four of the memory chips 92 are found completely defective, each of the chips 92 having a design memory capacity of 16 megabits, and another chip 92 exhibits 3 megabytes of defective memory, then a 3 megabit (partial 4 megabit) chip 100 can be attached to auxiliary location 98 and a 64 megabyte chip 102 attached to auxiliary location 96. Various other combinations could also be devised depending on the KGD on hand and the memory size of those KGD.

Figure 7:
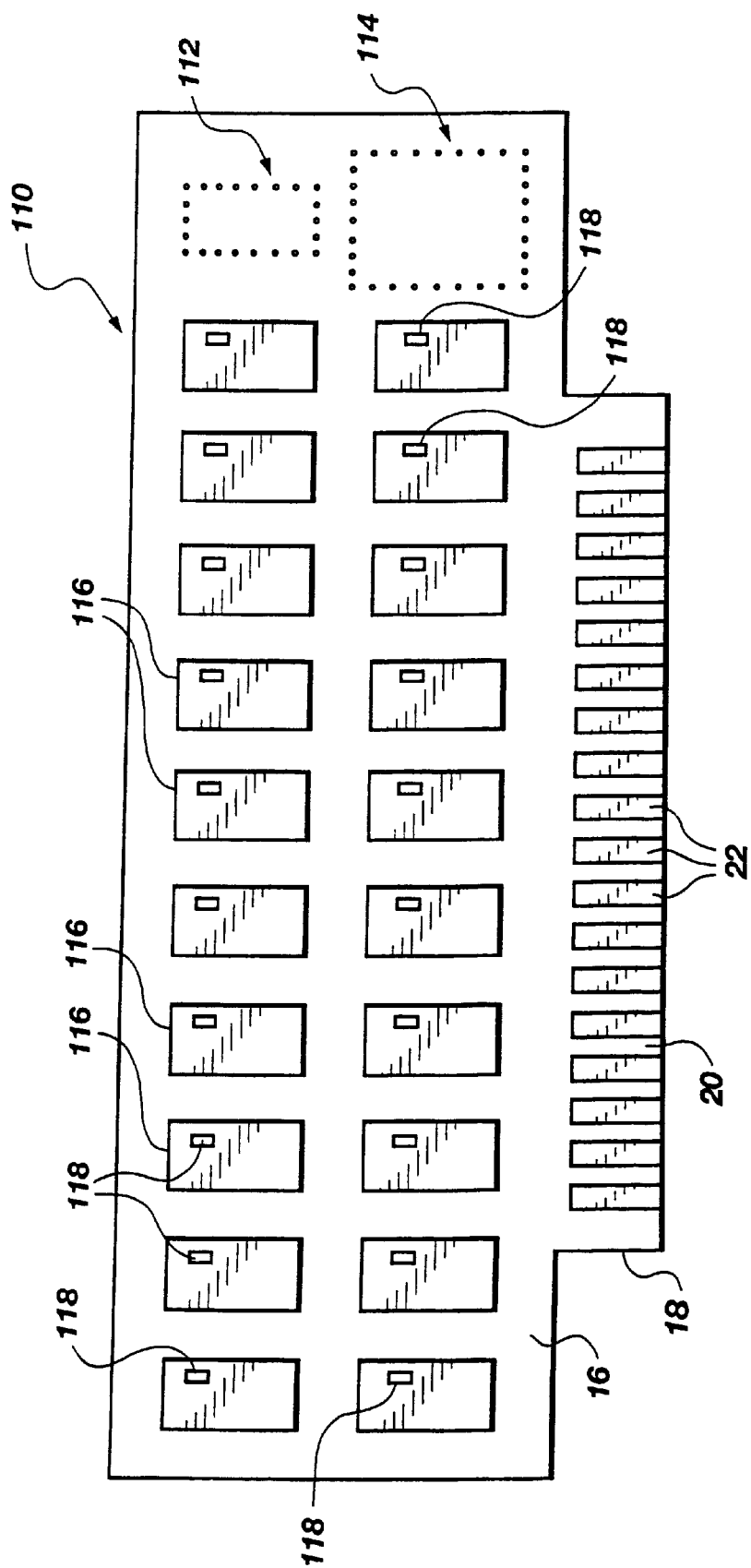
FIG. 7 is a schematic view of a fourth embodiment of a memory module having two auxiliary chip attach locations according to the present invention.

As shown in FIG. 7, it is contemplated that more than one auxiliary chip attach location 112 and 114 be provided on the memory device 110, each of the auxiliary locations 112 and 114 capable of accepting a different replacement chip. In this preferred embodiment, the single auxiliary location 82, as shown in FIG. 5, has been divided into two auxiliary locations 112 and 114. Accordingly, depending on the number, if any, of defective or bad chips 116, various combinations of known-good replacement chips can be selected depending on the size and memory size of those on hand.

Figure 8:
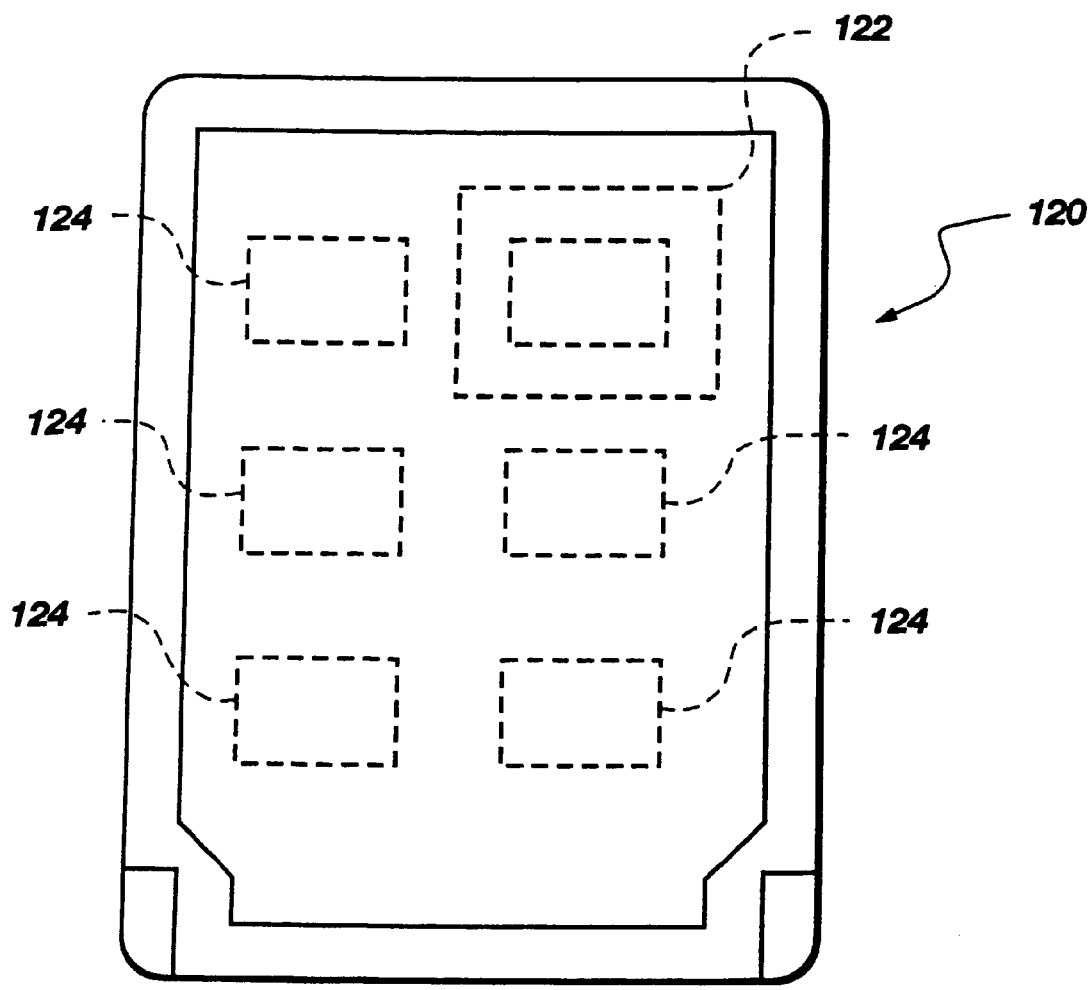
FIG. 8 is a schematic view of a memory card in accordance with the present invention.

It is also contemplated that various other memory modules known in the art, such as the DRAM card 120 illustrated in FIG. 8, could include at least one auxiliary chip site 122 for replacement of defective memory of primary chips 124. Moreover, those skilled in the art will appreciate that, while not specifically illustrated, other multi-chip modules may also include and benefit from at least one redundant or auxiliary chip attach location.

Figure 9:
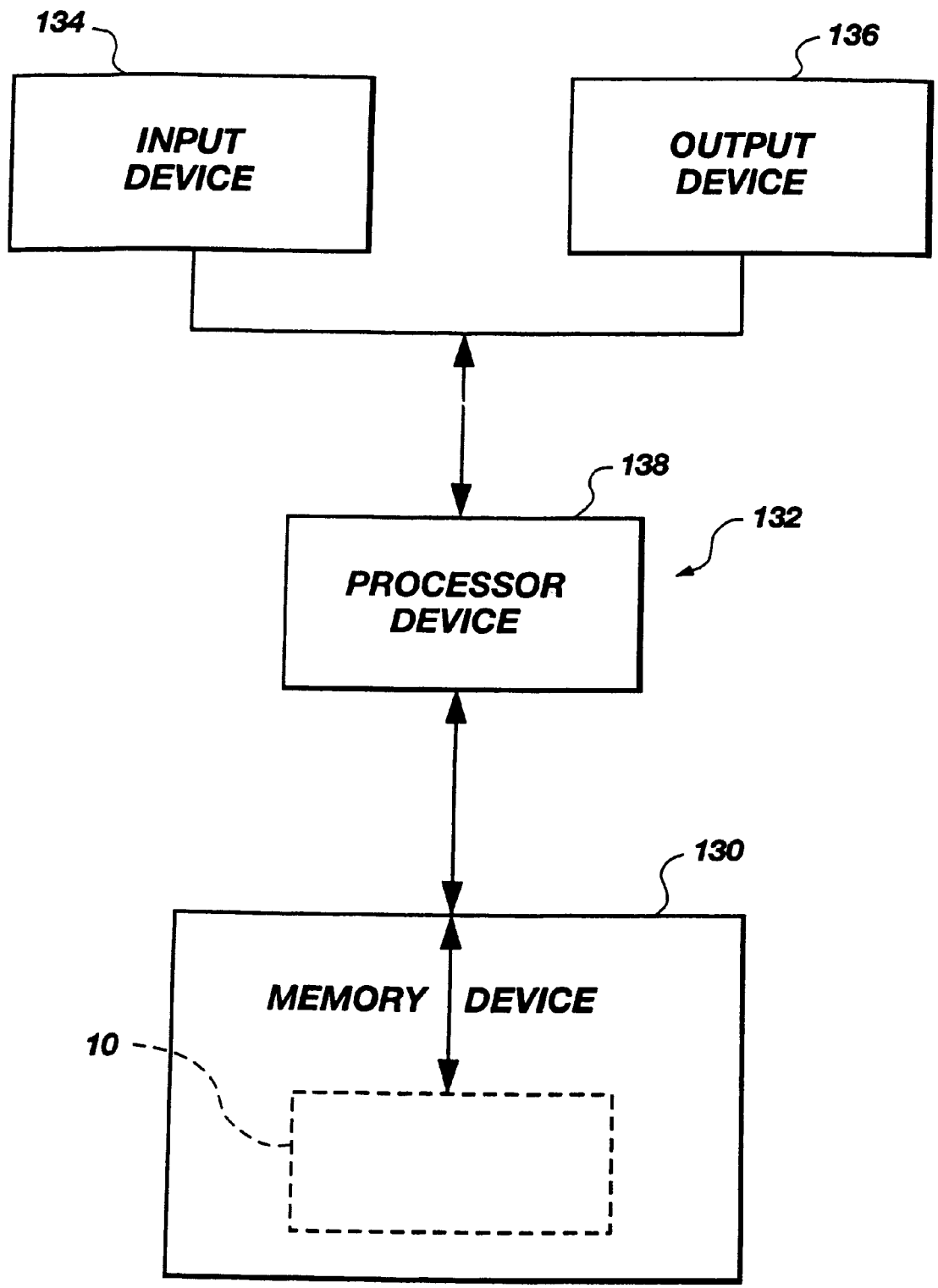
FIG. 9 is a diagrammatical view of an electronic system utilizing a memory module in accordance with the present invention.

Finally, as shown in FIG. 9, the multi-chip modules of the various preferred embodiments herein described, such as SIMM 10 of FIG. 1, can be incorporated into a memory device 130 of an electronic system 132, such as a computer system, that includes an input device 134 and an output device 136 coupled to a processor device 138. Of course, the multi-chip module 10 can alternatively be incorporated into the input device 134, the output device 136, or the processor device 138.

It will be appreciated by those skilled in the art that various methods can be used to achieve the desired memory capability of the memory device, such as use of enabling and/or disabling devices 118 located on each chip 116 of FIG. 7. The enabling and/or disabling devices 118 may include fuses, antifuses, and other such devices known in the art that can fully or partially disable the memory capacity of a chip 116. Furthermore, a programmable device such as a so-called "traffic control" EEPROM as known in the art may be installed on each module and programmed based on burn-in results to reroute input and output paths and link the new KGD auxiliary chips to the remainder of memory on the module so as to present an interface to the mother board or other higher-level packaging which is indistinguishable to the host system from a perfect as-fabricated module with 100% good primary or original memory. Such a traffic control EEPROM is illustrated at 86 in FIG. 5.

Those skilled in the art will also appreciate that the number and configuration of auxiliary chip attach locations may vary, depending on the configuration of replacement chips and the needs of the user. Further, while the invention has been described with relation to memory devices, the invention may be practiced on many other multi-chip modules where a single chip attach location having the capability to accept various semiconductor devices could reduce the time and cost associated with rework.

It should be noted that the term "chip", as used in the specification and appended claims is intended as exemplary and not limiting, the invention having applicability to any packaged die, bare die, and/or any intermediate product thereof. In addition, while the preferred embodiments were illustrated as being flip-chip bonded to the substrate, the dice, whether replacement or otherwise, may be wire bonded or otherwise electrically attached to the substrate as known in the art.

It will also be appreciated by one of ordinary skill in the art that one or more features of any of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A method of constructing an electronic system, comprising:
    providing at least one memory device;
    providing at least one processor device;
    providing at least one repairable memory module including at least one substrate;
    providing a plurality of primary memory chip attach sites on the at least one substrate;
    providing at least one vacant auxiliaty memory chip attach site on the at least one substrate; and
    configuring the at least one vacant auxiliary memory chip attach site to accept a memory chip of at least two different sizes.

2. The method of claim 1, further comprising providing a plurality of primary memory chips and attaching at least one primary memory chip of the plurality of primary memory chips to each of the plurality of primary memory chip attach sites.

3. The method of claim 2, further comprising coupling the at least one repairable memory module to the at least one memory device.

4. The method of claim 3, further comprising installing the at least one repairable memory module within the at least one memory device.

5. The method of claim 2, further comprising:
    providing at least one input device;

providing at least one output device; and coupling the at least one input device and the at least one output device to the at least one processor device.

6. The method of claim 5, further comprising installing the at least one repairable memory module within one of the group consisting of the at least one processor device, the at least one input device, and the at least one output device.

7. The method of claim 2, further comprising providing at least one memory chip having an amount of functional memory equal to or greater than an amount of nonfunctional memory of the plurality of primary memory chips and attaching the at least one memory chip to at least one previously vacant auxiliary chip attach site.

8. The method of claim 7, further comprising disabling the nonfunctional memory of the plurality of primary memory chips.

9. The method of claim 5, wherein providing a plurality of primary chip attach sites comprises providing a number of primary memory chip attach sites which exceeds a number of vacant auxiliary memory chip attach sites.

10. The method of claim 5, further comprising providing the at least one substrate with a male, socket-type connector including a plurality of contacts longitudinally extending along a side of the at least one substrate.

11. The method of claim 5, wherein providing at least one repairable memory module comprises configuring the at least one repairable memory module as a SIMM, a DIMM, or a memory card.

12. The method of claim 11, wherein providing the plurality of primary memory chips comprises configuring each of the plurality of primary memory chips to have substantially the same memory capacity.

13. The method of claim 12, wherein providing the plurality of primary memory chips comprises detecting at least one primary memory chip having an amount of nonfunctional memory, and further comprising providing and attaching at least one memory chip to at least one previously vacant auxiliary memory chip attach site, the at least one memory chip providing functional memory to the at least one repairable memory module in an amount equivalent to or greater than the amount of nonfunctional memory.

14. The method of claim 13, wherein providing and attaching at least one memory chip comprises providing and attaching at least one known good die.

15. The method of claim 13, further comprising disabling the nonfunctional memory.

16. The method of claim 13, wherein providing and attaching at least one memory chip to at least one previously vacant auxiliary memory chip attach site comprises providing and attaching at least one memory chip having more functional memory than a single primary memory chip of the provided and attached plurality of primary memory chips.

17. The method of claim 13, wherein providing and attaching at least one memory chip comprises electrically connecting the at least one memory chip to conductors on the at least one substrate differently than at least one of the plurality of primary memory chips.

18. The method of claim 13, wherein providing and attaching the plurality of primary memory chips comprises electrically connecting the plurality of primary memory chips to the at least one substrate through a first type of interface and electrically connecting the at least one primary memory chip to the at least one substrate through a different type of interface.

19. The method of claim 13, wherein providing and attaching at least one memory chip to at least one previously vacant auxiliary memory chip attach site comprises providing and attaching at least one memory chip having at least some functional memory to the at least one previously vacant auxiliary memory chip attach site.

20. The method of claim 13, wherein providing and attaching at least one memory chip to at least one previously vacant auxiliary memory chip attach site comprises attaching at least one memory chip selected from the group comprising a packaged semiconductor die, a bare semiconductor die, and an intermediate semiconductor die product.

21. The method of claim 17, wherein electrically connecting at least one memory chip comprises electrically connecting the at least one memory chip to the at least one substrate by at least one of the group comprising wire bonding and flip-chip bonding.

* * * * *

UNITED STATES PATENT AND TRADEMARK OFFICE
CERTIFICATE OF CORRECTION

PATENT NO. : 6,274,390 B1  
APPLICATION NO. : 09/652274  
DATED : August 14, 2001  
INVENTOR(S) : Salman Akram, James M. Wark and David R. Hembree It is certified that error appears in the above-identified patent and that said Letters Patent is hereby corrected as shown below:

In the specification:

| | | |
|---|---|---|
| COLUMN 2, | LINE 16, | change "bum-in" to --burn-in-- |
| COLUMN 2, | LINE 59, | change "which ate costly" to --which are costly-- |
| COLUMN 3, | LINE 1, | change bum-in" to --burn-in-- |
| COLUMN 4, | LINE 32, | change "attacbed" to --attached-- |

In the claims:

CLAIM 1, COLUMN 8, LINE 50, change "auxiliaty" to --auxiliary--

Signed and Sealed this

Fourth Day of September, 2007

JON W. DUDAS  
*Director of the United States Patent and Trademark Office*

UNITED STATES PATENT AND TRADEMARK OFFICE
CERTIFICATE OF CORRECTION

PATENT NO. : 6,274,390 B1
APPLICATION NO. : 09/652274
DATED : August 14, 2001
INVENTOR(S) : Salman Akram, James M. Wark and David R. Hembree It is certified that error appears in the above-identified patent and that said Letters Patent is hereby corrected as shown below:

In the specification:

| | | |
|---|---|---|
| COLUMN 2, | LINE 16, | change "bum-in" to --burn-in-- |
| COLUMN 2, | LINE 59, | change "which ate costly" to --which are costly-- |
| COLUMN 3, | LINE 1, | change "bum-in" to --burn-in-- |
| COLUMN 4, | LINE 32, | change "attacbed" to --attached-- |

In the claims:
CLAIM 1, COLUMN 8, LINE 50, change "auxiliaty" to --auxiliary--

Signed and Sealed this

Twenty-fifth Day of September, 2007

JON W. DUDAS
*Director of the United States Patent and Trademark Office*